United States Patent [19]
Fowler

[11] Patent Number: 6,031,418
[45] Date of Patent: Feb. 29, 2000

[54] METHOD AND APPARATUS FOR DEMODULATING DIGITAL FREQUENCY MODULATION (FM) SIGNALS

[75] Inventor: Mark L. Fowler, Ithaca, N.Y.

[73] Assignee: Lockheed Martin Corporation, Bethesda, Md.

[21] Appl. No.: 09/196,327

[22] Filed: Nov. 19, 1998

[51] Int. Cl.[7] .............................. H03D 3/00; H03K 9/06; H04L 27/14
[52] U.S. Cl. ..................... 329/341; 329/300; 375/334; 455/214; 455/337
[58] Field of Search ................... 329/300–303, 329/341–343; 375/334–337; 455/205, 214, 337

[56] References Cited

U.S. PATENT DOCUMENTS

| | | |
|---|---|---|
| 4,455,533 | 6/1984 | Moraillon . |
| 4,486,716 | 12/1984 | Le Floch . |
| 4,528,511 | 7/1985 | Smith . |
| 4,543,532 | 9/1985 | Kasser . |
| 4,547,737 | 10/1985 | Gibson . |
| 4,631,489 | 12/1986 | Laird et al. . |
| 4,675,882 | 6/1987 | Lillie et al. . |
| 4,750,214 | 6/1988 | Hart et al. . |
| 4,799,025 | 1/1989 | Le Queau . |
| 4,910,469 | 3/1990 | Takahashi . |
| 5,220,583 | 6/1993 | Solomon . |
| 5,465,071 | 11/1995 | Kobayashi et al. . |
| 5,661,433 | 8/1997 | La Rosa et al. ........................ 329/341 |
| 5,703,527 | 12/1997 | Iwasaki . |
| 5,757,862 | 5/1998 | Ishizu . |

*Primary Examiner*—David Mis
*Attorney, Agent, or Firm*—Antony P. Ng; Andrew J. Dillon; Robert P. Cogan

[57] ABSTRACT

A method for demodulating digital frequency modulation (FM) signals is disclosed. A group of complex-valued discrete-time FM signal samples is initially received. A corresponding first complex product for each of the complex-valued discrete-time FM signal samples is computed, and a corresponding second complex product for each of the first complex values of the complex-valued discrete-time FM signal samples is computed. Subsequently, an inverse tangent of the second complex products are computed to yield an angle for each of the second complex values, wherein each of the angles represents a second-order difference of a phase of the complex-valued discrete-time FM signal samples. Finally, a digital integration is performed to obtain a first-order difference of the phase of the complex-valued discrete-time FM signal samples.

18 Claims, 3 Drawing Sheets

Fig. 1 *Prior Art*

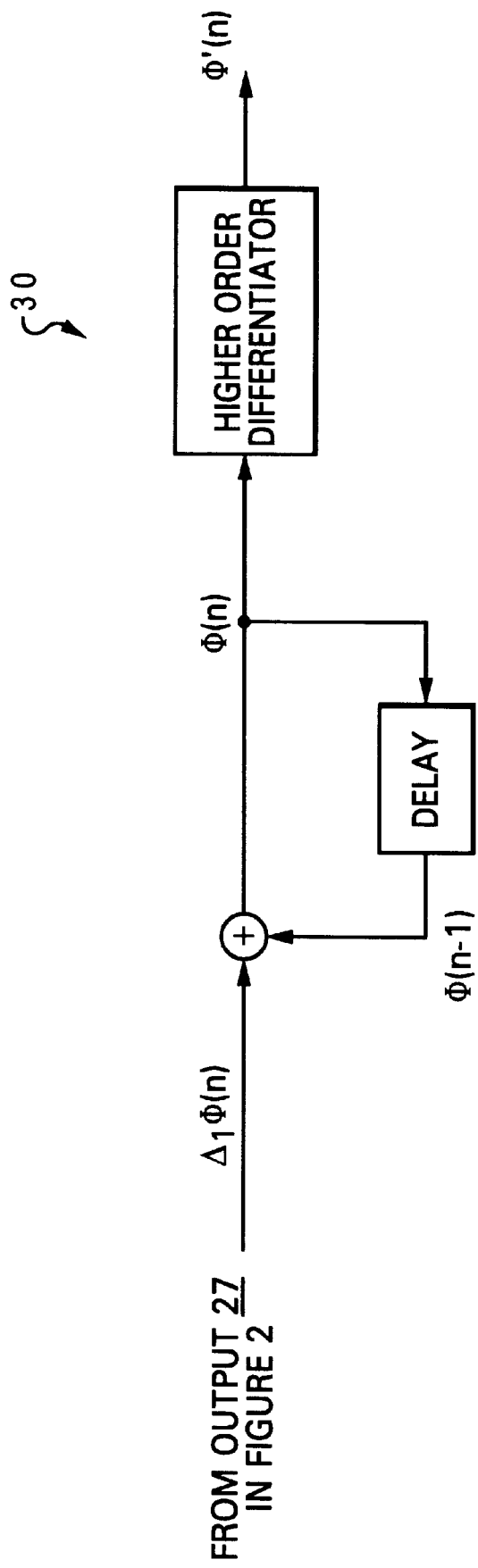

METHOD AND APPARATUS FOR DEMODULATING DIGITAL FREQUENCY MODULATION (FM) SIGNALS

BACKGROUND OF THE INVENTION

1. Technical Field

The present invention relates to a method and apparatus for frequency modulation in general, and in particular to a method and apparatus for demodulating frequency modulation signals. Still more particularly, the present invention relates to a method and apparatus for demodulating digital frequency modulation signals in communication systems.

2. Description of the Prior Art

Frequency modulation (FM) is utilized in many types of communication systems, such as FM radio broadcast, television, analog cellular telephony, and a variety of remote sensing applications in which measured analog signals are transmitted from a remote site to a central site for processing. Traditionally, FM signals are demodulated using analog processing techniques. However, in recent years, analog signal processing has been largely replaced by digital signal processing (DSP) in order to exploit the many advantages of digital processing techniques.

Because the information in FM signals is encoded within a time varying phase angle of a sinusoidal signal, most of the prior art digital FM demodulation algorithms utilize inverse trigonometric functions in general, and the inverse tangent (also called arc tangent) in particular, for extracting the encoded information. Generally speaking, there are two principal methods that are commonly utilized to compute the inverse trigonometric functions for FM demodulation: (i) consulting a lookup table that maps each measured FM signal value with a corresponding angle value, and (ii) approximating the inverse trigonometric functions using a polynomial. One disadvantage of the lookup table method is that high-performance FM demodulation requires a relatively large lookup table, which implies a large amount of memory is needed. Another disadvantage of the lookup table method is that additional processing such as signal scaling and point interpolation between table entries are typically required. On the other hand, there are also disadvantages associated with the polynomial approximation method; one disadvantage being a large amount of processing time is required to compute the approximating polynomial. Thus, in order to achieve high-performance FM demodulation with the existing methods, a designer must choose between large memory requirement (for the lookup table method) and long processing time (for the polynomial approximation method). In addition, prior art digital methods typically require a higher sampling rate than is necessary to accurately digitize the signal. This higher sampling rate is needed to avoid degradations due to noise induced wrapping of positive digital frequencies into negative digital frequencies or vice versa.

Consequently, it would be desirable to provide an improved method for demodulating digital FM signals, with no increase in memory requirement, processing time, and sampling rate.

SUMMARY OF THE INVENTION

In accordance with the method and apparatus of the present invention, a group of complex-valued discrete-time FM signal samples is initially received. A corresponding first complex product for each of the complex-valued discrete-time FM signal samples is computed, and a corresponding second complex product for each of the first complex values of the complex-valued discrete-time FM signal samples is computed. Subsequently, an inverse tangent of the second complex products are computed to yield an angle for each of the second complex values, wherein each of the angles represents a second-order difference of a phase of the complex-valued discrete-time FM signal samples. Finally, a digital integration is performed to obtain a first-order difference of the phase of the complex-valued discrete-time FM signal samples.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 3 is a block diagram of an additional structure for the FM demodulator from FIG. 2 to provide additional processing, in accordance with a preferred embodiment of the present invention.

DETAILED DESCRIPTION OF A PREFERRED EMBODIMENT

Let s(t) be a continuous-time message signal to be sent via some frequency modulation (FM) carrier signals. For the convenience of illustration, s(t) is normalized such that $-1 < s(t) < 1$ for all time values t. The corresponding FM radio frequency (RF) signal $y_{RF}(t)$ is given by:

$$y_{RF}(t) = \cos\left(2\pi f_c t + 2\pi \Delta f \int_{-\infty}^{t} S(\tau) d\tau\right) \quad (1)$$
$$= \cos(2\pi f_c t + \phi(t))$$

where $f_c$ is the carrier frequency of an FM signal and $\Delta f$ is the frequency deviation.

The goal of FM demodulation is to untangle equation (1) to recover the continuous-time message signal s(t) at a receiving end of the FM signals. In theory, the untangling includes an extraction of the phase $\Phi(t)$ from equation (1) and a differentiation of the extracted phase $\Phi(t)$ with respect to time, as follows:

$$s(t) = \frac{1}{2\pi \Delta f} \frac{d\phi(t)}{dt} \quad (2)$$

In practice, although the untangling can be accomplished in many ways, virtually all DSP based FM demodulation techniques start by converting $y_{RF}(t)$ from equation (1) into an equivalent sampled complex-valued baseband form, given by:

$$y(nT_s) = e^{j\Phi(nT_s)} \quad (3)$$

where $T_s$ is a sampling interval chosen to be short enough to represent the FM signal with negligible frequency aliasing.

Equation (3) can be further simplified by suppressing the explicit display of the sampling interval $T_s$, as follows:

$$y(n)=e^{j\Phi(n)} \qquad (4)$$

The discrete-time FM signal samples y(n) from equation (4) are then demodulated to recover discrete-time message signal samples s(n). Finally, a digital-to-analog converter can be utilized to convert the discrete-time message signal samples s(n) to a continuous-time message signal s(t).

Figure 1:
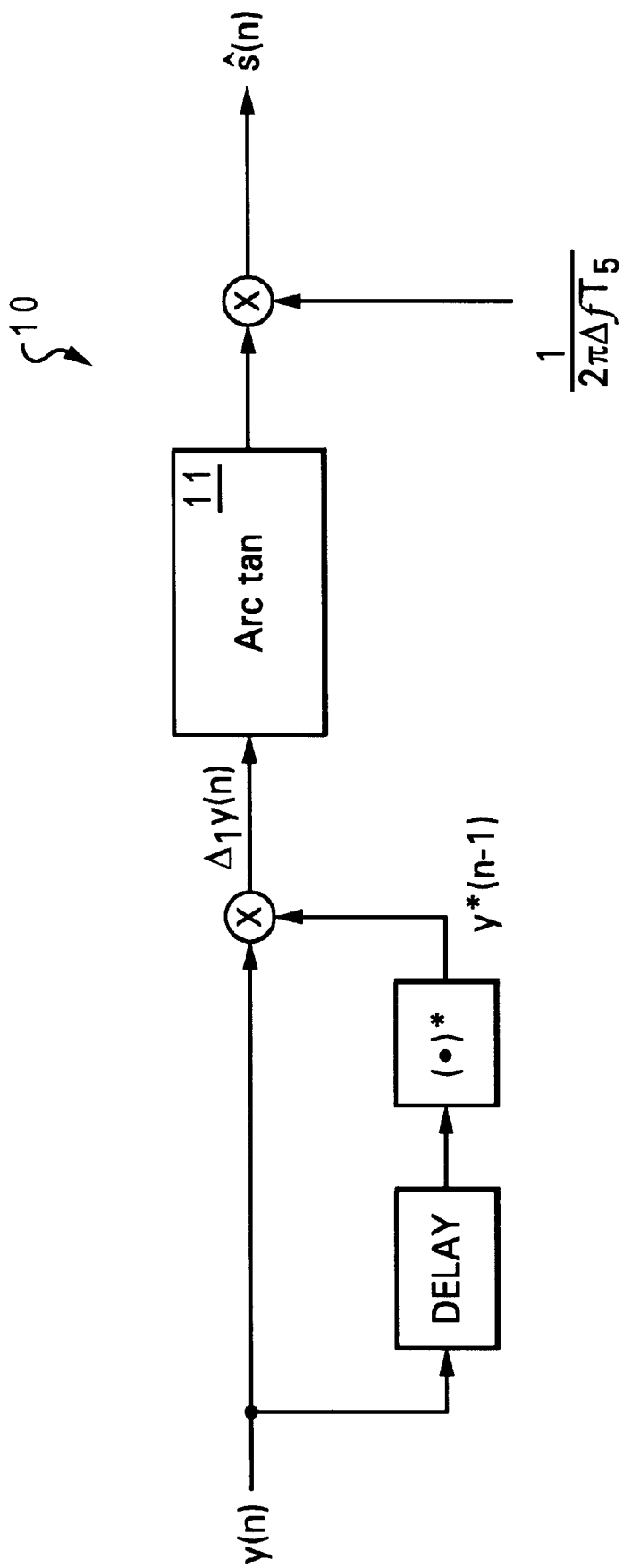
FIG. 1 is a block diagram of a FM demodulator in accordance with the prior art.

Referring now to the drawings and in particular to FIG. 1, there is depicted a block diagram of a FM demodulator in accordance with the prior art. FM demodulator 10, as shown in FIG. 1, implements the following equations:

$$\Delta_1 y(n) = y(n) \times y^*(n-1)$$
$$= e^{j[\phi(n)-\phi(n-1)]}$$

and $$\hat{s}(n) = \frac{\text{Arctan}[Re\{\Delta_1 y(n)\}, Im\{\Delta_1 y(n)\}]}{2\pi \Delta f T_s}$$

where ŝ(n) is an estimation of the discrete-time message signal s(n), and Arctan [·,·] is a two-variable version of the inverse tangent function that yields results over all four quadrants (instead of only two quadrants in a single-variable version). In addition, the sampling rate $F_s=1/T_s$ must be chosen such that $F_s>2 \max\{\Delta f,B\}$, where B is the bandwidth of the message signal s(t), in order to avoid any frequency aliasing. For most applications, Δf is greater than B. The estimated discrete-time message signal ŝ(n) can be written as:

$$\hat{s}(n) = \frac{1}{2\pi \Delta f T_s}[\phi(n) - \phi(n-1)] \qquad (5)$$

Equation (5) can be interpreted as a discrete-time version of equation (2). The phase difference Φ(n)−Φ(n−1) in equation (5) is implemented with an Arctan block 11 in FM demodulator 10 from FIG. 1.

As mentioned previously, one disadvantage of prior art FM demodulators, such as FM demodulator 10, is that the computation of the arc tangent function generally requires a large lookup table or a long computation time. In addition, if the received FM signal is expected to contain a significant amount of noise, the sampling rate $F_s$ must be set far above the minimal 2Δf in order to reduce the probability of the noise caused wrapping of the digital frequency estimates in equation (5). In other words, a much higher sampling rate is typically required for FM demodulator 10 to produce a good performance at low signal-to-noise ratio (SNR) environments. Incidentally, the increased sampling rate will place additional burden on the computational power required to perform FM demodulation in real time.

Figure 2:
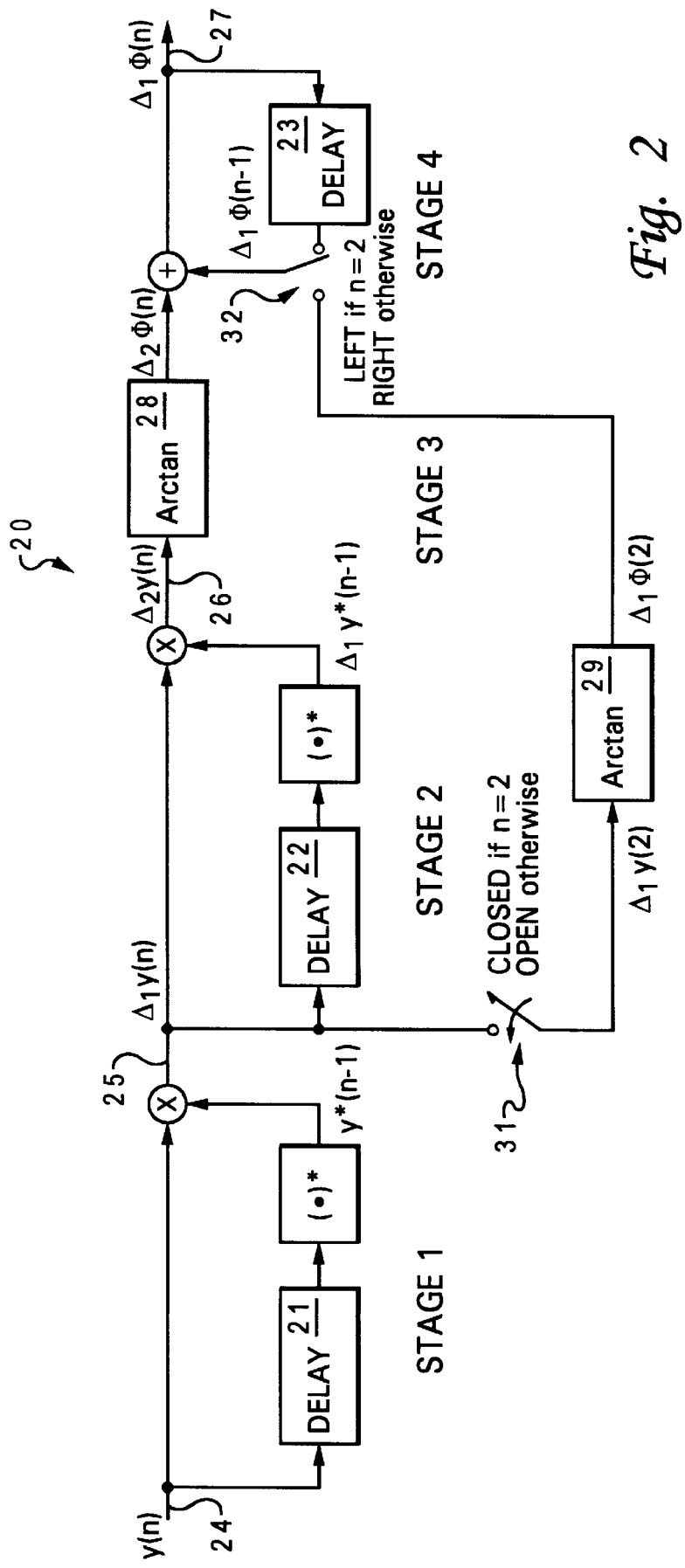
FIG. 2 is a block diagram of a FM demodulator in accordance with a preferred embodiment of the present invention.

With reference now to FIG. 2, there is depicted a block diagram of a FM demodulator in accordance with a preferred embodiment of the present invention. As shown, a FM demodulator 20 includes four separate and distinct stages of processing. Discrete-time samples of the complex-valued baseband FM signal from equation (4), that is $$y(n)=e^{j\Phi(n)}, \text{ for } n=1,2,3,\ldots$$

are sent to FM demodulator 20 for FM demodulation. In the first stage (stage 1), delay block 21 is initialized to hold y(0)=0, and the discrete-time FM signal samples (i.e., y(1), y(2), ...) are sequentially applied to input 24. Output 25 of the first stage is given by:

$$\Delta_1 y(n)=y(n) \times y^*(n-1) \text{ for } n=1, 2, 3, \ldots$$

or $$\Delta_1 y(1)=y(1) \times y^*(0)=0$$

$$\Delta_1 y(2)=y(2) \times y^*(1)$$

$$\Delta_1 y(3)=y(3) \times y^*(2)$$

where y*(n−1) is a complex conjugate of the signal sample y(n−1). The value $\Delta_i y(2)$ is saved to be used in the fourth stage (stage 4).

The second stage (stage 2) operates in the same way as the first stage. Delay block 22 is initialized to hold $\Delta_1 y$ (0)=0 and the values of $\Delta_1 y(n)$ (i.e., $\Delta_1 y(1)$, $\Delta_1 y(2)$, ...) are sequentially applied to the second stage input. Output 26 of the second stage is given by:

$$\Delta_2 y(n)=\Delta_1 y(n) \times \Delta^*_1 y(n-1) \text{ for } n=1, 2, 3, \ldots$$

or $$\Delta_2 y(1)=\Delta_1 y(1) \times \Delta_1 y^*(0)=0$$

$$\Delta_2 y(2)=\Delta_1 y(2) \times \Delta_1 y^*(1)=0$$

$$\Delta_2 y(3)=\Delta_1 y(3) \times \Delta_1 y^*(2)$$

where $\Delta^*_1 y(n-1)$ is a complex conjugate of the complex product $\Delta_1 y(n-1)$. Because $\Delta_2 y(n)$ from output 26 of the second stage are complex numbers, $\Delta_2 y(n)$ can be expressed in a magnitude/angle format, as follows:

$$\Delta_2 y(n)=m(n)e^{j\Delta_2\Phi(n)}$$

where m(n) is the magnitude of $\Delta_2 y(n)$ and $\Delta_2 \Phi(n)$ is the second-order backward difference of Φ(n) as defined by $\Delta_2 \Phi(n)=\Phi(n)-2\Phi(n-1)+\Phi(n-2)$.

In the third stage (stage 3), the inverse tangent of the complex valued outputs (i.e., $\Delta_2 y(n)$) from the second stage are computed. The results are the angle of each of the complex numbers, as follows:

$$\Delta_2 \Phi(n)=\text{Arctan }[Re\{\Delta_2 y(n)\}, Im\{\Delta_2 y(n)\}]$$

Details on the implementation of this inverse tangent are described infra. Note that the angles of the complex numbers represent the second-order differences of the phase Φ(n) in equation (4).

In the fourth stage (stage 4), a digital integration is performed to obtain the first-order difference of the phase Φ(n) in equation (4). Delay block 23 is initialized with $\Delta_1 \Phi(0)=0$, and the values of $\Delta_2 \Phi(n)$ (i e., $\Delta_2 \Phi(1)$, $\Delta_2 \Phi(2)$, ...) are sequentially applied to the fourth stage input. Output 27 of the fourth stage is given by:

$$\Delta_1 \phi(0) = 0 \qquad \text{(initialized delay value)}$$
$$\Delta_1 \phi(1) = \Delta_2 \phi(1) + \Delta_1 \phi(0) = 0$$
$$\Delta_1 \phi(2) = \Delta_2 \phi(2) + \text{Arctan}[\Delta_1 y(2)]$$
$$\qquad = \text{Arctan}[\Delta_1 y(2)] \qquad \text{(switched in from stage 1)}$$
$$\Delta_1 \phi(n) = \Delta_2 \phi(n) + \Delta_1 \phi(n-1), \quad \text{for } n = 3, 4, 5, \ldots$$

These first-order differences of the phase Φ(n) can then be utilized to approximate the derivative of dΦ(t)/dt via a division by the sampling interval $T_s$ (or, equivalently, a multiplication with the sampling rate $F_s$). Thus, the estimated discrete time samples of the demodulated message signals are, as follows:

$$\hat{s}(n) = \frac{1}{2\pi\Delta f T_s} \Delta_1 \phi(n) \text{ for } n = 2, 3, 4...$$

This additional scaling of $\Delta_1\Phi(n)$ is not shown in FIG. 2, but it is essentially identical to the final scaling operation as shown in FIG. 1.

Switch 31 in the second state and switch 32 in the forth stage operate as follows. Switch 31 closes only when n=2 and remains open otherwise. Switch 32 closes to the left only when n=2, and closes to the right otherwise. The progression of values through FM demodulator 20 for n=1 to 7 is summarized in Table I.

TABLE I

| n | 1 | 2 | 3 | 4 | 5 | 6 | 7 |
|---|---|---|---|---|---|---|---|
| input 24 | y(1) | y(2) | y(3) | y(4) | y(5) | y(6) | y(7) |
| delay 21 | 0 | y(1) | y(2) | y(3) | y(4) | y(5) | y(6) |
| output 25 | 0 | $\Delta_1 y(2)$ | $\Delta_1 y(3)$ | $\Delta_1 y(4)$ | $\Delta_1 y(5)$ | $\Delta_1 y(6)$ | $\Delta_1 y(7)$ |
| delay 22 | 0 | 0 | $\Delta_1 y(2)$ | $\Delta_1 y(3)$ | $\Delta_1 y(4)$ | $\Delta_1 y(5)$ | $\Delta_1 y(6)$ |
| output 26 | 0 | 0 | $\Delta_2 y(3)$ | $\Delta_2 y(4)$ | $\Delta_2 y(5)$ | $\Delta_2 y(6)$ | $\Delta_2 y(7)$ |
| Arctan 28 | 0 | 0 | $\Delta_2\phi(3)$ | $\Delta_2\phi(4)$ | $\Delta_2\phi(5)$ | $\Delta_2\phi(6)$ | $\Delta_2\phi(7)$ |
| Arctan 29 | — | $\Delta_1\phi(2)$ | — | — | — | — | — |
| delay 23 | 0 | 0 | $\Delta_1\phi(2)$ | $\Delta_1\phi(3)$ | $\Delta_1\phi(4)$ | $\Delta_1\phi(5)$ | $\Delta_1\phi(6)$ |
| output 27 | 0 | $\Delta_1\phi(2)$ | $\Delta_1\phi(3)$ | $\Delta_1\phi(4)$ | $\Delta_1\phi(5)$ | $\Delta_1\phi(6)$ | $\Delta_1\phi(7)$ |

At this point, the estimated discrete-time signal sample $\hat{s}(n)$ will be sampled at a much higher rate than needed because its bandwidth is smaller than that of $\Delta f$. The estimated discrete-time signal sample $\hat{s}(n)$ is typically filtered and decimated as in all DSP based FM demodulation techniques. The resulting samples may be further processed via more DSP techniques or converted back into a continuous time signal via a digital-to-analog converter as is known in the art.

There are two advantages gained from the preferred embodiment of the present invention: (i) the computation of the arc tangent is simplified, and (ii) a lower sampling rate may be utilized. The first advantage can be achieved because the angle at the output of the arc tangent function (i.e., Arctan block 28 in stage 3) is a double difference and therefore is smaller than the single difference as done in the prior art of FIG. 1. In fact, this angle is very small that it is possible to use a simple approximation for the arc tangent, and thereby reduce the effort needed to compute the arc tangent, without significantly sacrificing accuracy. Specifically, the angle $\Delta_2\Phi(n)$ is so small that the angle $\Delta_2\Phi(n)$ is always in either the first or the fourth quadrant, where the two-variable, four-quadrant arc tangent can be replaced by a single-variable, two-quadrant version, as follows:

$$\Delta_2\Phi(n) = Arctan[Re\{\Delta_2 y(n)\}, Im\{\Delta_2 y(n)\}] = Arctan[R(n)]$$

where $$R(n) = \frac{Im\{\Delta_2 y(n)\}}{Re\{\Delta_2 y(n)\}}$$

With the single-variable, two-quadrant version, the arc tangent can be expressed in terms of a series expansion, as follows:

$$\Delta_2\phi(n) = Arctan[R(n)]$$
$$= R(n) - \frac{R^3(n)}{3} + \frac{R^5(n)}{5} + \frac{R^7(k)}{7} + ...$$

Because the angle $\Delta_2\Phi(n)$ is small and $|R(n)|$ is much less than 1, the high-order terms in the above-shown series expansion can be neglected with little error. Thus, $$\Delta_2\phi(n) \approx R(n) \tag{6}$$
$$\approx \frac{Im\{\Delta_2 y(n)\}}{Re\{\Delta_2 y(n)\}}$$

Because the angle $\Delta_2\Phi(n)$ is small, the denominator in equation (6) is approximately constant, and furthermore, the angle $\Delta_2\Phi(n)$ is only needed to be known up to a multiplicative constant, thus equation (6) can be further simplified to:

$$\Delta_2\Phi(n) \approx Im\{\Delta_2 y(n)\} \tag{7}$$

As shown, equations (6) and (7) provide two simple alternative ways to compute the arc tangent function as shown in Arctan block 28 (and Arctan block 29 for n=2) of FIG. 2.

If a better approximation of the arc tangent function is required, a two-term truncation of the series expansion can be utilized to estimate the arc tangent, with slightly more computational complexity, as follows:

$$\Delta_2\phi(n) \approx R(n) - \frac{R^3(n)}{3} \tag{8}$$

Any one of equations (6) through (8) demonstrates the first advantage of using the FM demodulation structure as shown in FIG. 2, namely, the double differences phase that admits the exploitation of any one of three simple, yet accurate, approximations to the arc tangent function calculation.

A second advantage of the FM demodulation structure of the present invention is a sampling rate lower than that is required in the prior art. This lower sampling rate can be achieved because there is less likelihood of errors due to noise induced phase wrapping across the $-\pi/\pi$ phase boundary when computing the arc tangent function. These errors are less likely because the double differenced phase is small and remains far from the $-\pi/\pi$ phase boundary and therefore can survive larger levels of noise before experiencing a noise induced phase wrapping error.

An additional structure for further processing the signal obtained from output 27 can be coupled to FM demodulator 20 in FIG. 2 to yield an approximation of the derivative of $d\Phi(t)/dt$ that is better than the first-order difference computed in FIG. 2 while retaining the low sampling rate. This is accomplished by a structure 30 shown in FIG. 3. Structure 30 can be considered as a fifth stage, which is identical to the fourth stage of FIG. 2. Structure 30 is added to the fourth stage to recover an unwrapped version of $\Phi(n)$, which is then differentiated using either: (i) one of many available higher order approximations to the derivative that are well known in the numerical analysis literature, or (ii) a digital differentiating filter, whose design is well-known in the art of digital filters. An example of a higher order derivative approximation is:

$$\phi'(n) = \frac{\phi(n-2) - 8\phi(n-1) + 8\phi(n+1) - \phi(n+2)}{12}$$

This approximation of the derivative $d\Phi(t)/dt$ is then scaled to give $$\hat{s}(n) = \frac{1}{2\pi\Delta f T_s}\phi'(n)$$

This additional scaling of $\Phi'(n)$ is not shown in FIG. 3, but is identical to the final scaling operation shown for the method of FIG. 1.

This additional structure has all the advantages of the structure shown in FIG. 2 and discussed above, namely, (i) easy computation of the arc tangent function, and (ii) improved performance at low SNRs because of the reduced likelihood of noise induced phase wrapping. It has the additional benefit that it can use a higher-order approximation to the derivative to give a better result than is possible through the first-order difference approximation inherent in the method shown in FIG. 2. The cost of this additional benefit is the small additional computation due to the fifth stage shown in FIG. 3, and the additional computation due to the explicit higher-order differentiator shown in FIG. 3. The expense of the latter increases as higher-order differentiators are used and must be weighed against the improvements gained by using a higher-order approximation.

As has been described, the present invention provides an improved method for demodulating digital frequency modulation signals. Although the present invention also operates on the samples of equation (3) as in the prior art, it operates in a way that is different from the prior art methods. The present invention makes the required inverse trigonometric function much easier to compute. In addition, the present invention obtains good performance even at low SNRs without requiring an increased sampling rate.

It should be noted that the digital modulation scheme known as frequency shift keying (FSK) can also use in conjunction with the present invention. The present invention would convert the FSK signal into a baseband pulse train that can be easily detected to recover the transmitted bits. In short, the present invention allows FM demodulation to be done at a lower sample rate and with less computational complexity, which enables a smaller and lower power package.

It is also important to note that although the present invention has been described in the context of a fully functional FM demodulator, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for demodulating digital frequency modulation (FM) signals, said method comprising the steps of:

receiving a plurality of complex-valued discrete-time FM signal samples;

computing first complex products of said plurality of complex-valued discrete-time FM signal samples;

computing second complex products of said first complex products of said plurality of complex-valued discrete-time FM signal samples;

computing an inverse tangent of said second complex products to yield an angle for each of said second complex products, wherein each of said angles represents a second-order phase difference of said complex-valued discrete-time FM signal samples; and performing a digital integration to obtain a first-order phase difference of said complex-valued discrete-time FM signal samples.

2. The method according to claim 1, wherein said plurality of complex-valued discrete-time FM signal samples are in the form of $y(n)=m(n)\ e^{j\Phi(n)}$.

3. The method according to claim 1, wherein said step of computing first complex products further includes a step of multiplying a complex-valued discrete-time FM signal sample and its delayed complex conjugate.

4. The method according to claim 1, wherein said step of computing second complex products further includes a step of multiplying a second complex product and its delayed complex conjugate.

5. The method according to claim 1, wherein said method further includes a step of dividing said first-order difference of said phase of said complex-valued discrete-time FM signal samples by a sampling interval to obtain an estimation of a discrete-time message signal.

6. The method according to claim 1, wherein said step of computing an inverse tangent of said second complex products further includes a step of performing an approximation based on a small second-order phase difference of said complex-valued discrete-time FM signal samples.

7. A frequency modulation (FM) demodulator for demodulating digital FM signals, comprising:

means for receiving a plurality of complex-valued discrete-time FM signal samples;

means for computing first complex products of said plurality of complex-valued discrete-time FM signal samples;

means for computing second complex products of said first complex products of said plurality of complex-valued discrete-time FM signal samples;

means for computing an inverse tangent of said second complex products to yield an angle for each of said second complex products, wherein each of said angles represents a second-order phase difference of said complex-valued discrete-time FM signal samples; and means for performing a digital integration to obtain a first-order phase difference of said complex-valued discrete-time FM signal samples.

8. The FM demodulator according to claim 7, wherein said plurality of complex-valued discrete-time FM signal samples are in the form of $y(n)=m(n)\ e^{j\Phi(n)}$.

9. The FM demodulator according to claim 7, wherein said means for computing first complex products further includes a means for multiplying a complex-valued discrete-time FM signal sample and its delayed complex conjugate.

10. The FM demodulator according to claim 7, wherein said means for computing first complex products further includes a means for multiplying a second complex product and its delayed complex conjugate.

11. The FM demodulator according to claim 7, wherein said FM demodulator further includes a means for dividing said first-order difference of said phase of said complex-valued discrete-time FM signal samples by a sampling interval to obtain an estimation of a discrete-time message signal.

12. The FM demodulator according to claim 7, wherein said means for computing an inverse tangent of said second complex products further includes a means for performing an approximation based on a small second-order phase difference of said complex-valued discrete-time FM signal samples.

13. A computer program product residing on a computer usable medium for demodulating digital frequency modulation (FM) signals, said computer program product comprising:

program code means for receiving a plurality of complex-valued discrete-time FM signal samples;

program code means for computing first complex products of said plurality of complex-valued discrete-time FM signal samples;

program code means for computing second complex products of said first complex products of said plurality of complex-valued discrete-time FM signal samples;

program code means for computing an inverse tangent of said second complex products to yield an angle for each of said second complex products, wherein each of said angles represents a second-order phase difference of said complex-valued discrete-time FM signal samples; and program code means for performing a digital integration to obtain a first-order phase difference of said complex-valued discrete-time FM signal samples.

14. The computer program product according to claim 13, wherein said plurality of complex-valued discrete-time FM signal samples are in the form of $y(n)=m(n)\ e^{j\Phi(n)}$.

15. The computer program product according to claim 13, wherein said program code means for computing first complex products further includes a program code means for multiplying a complex-valued discrete-time FM signal sample and its delayed complex conjugate.

16. The computer program product according to claim 13, wherein said program code means for computing second complex products further includes a program code means for multiplying a second complex product and its delayed complex conjugate.

17. The computer program product according to claim 13, wherein said computer program product further includes a program code means for dividing said first-order difference of said phase of said complex-valued discrete-time FM signal samples by a sampling interval to obtain an estimation of a discrete-time message signal.

18. The computer program product according to claim 13, wherein said program code means for computing an inverse tangent of said second complex products further includes a program code means for performing an approximation based on a small second-order phase difference of said complex-valued discrete-time FM signal samples.

* * * * *